United States Patent [19]

Kakizaki et al.

[11] Patent Number: 5,053,617
[45] Date of Patent: Oct. 1, 1991

[54] INSTRUMENT FOR CONCURRENTLY OPTICALLY MEASURING THERMAL AND ELECTRIC QUANTITIES

[75] Inventors: Yuichi Kakizaki; Yoshinari Kozuka, both of Nagoya, Japan

[73] Assignee: NGK Insulators, Ltd., Aichi, Japan

[21] Appl. No.: 502,871

[22] Filed: Apr. 2, 1990

[30] Foreign Application Priority Data

Mar. 31, 1989 [JP] Japan .................................. 1-83002

[51] Int. Cl.$^5$ ..................... H01J 5/16; G01R 31/00; G01R 33/02; G01K 7/00
[52] U.S. Cl. ........................... 250/227.21; 250/231.1; 374/161; 324/244; 324/96; 359/246; 359/282; 359/288
[58] Field of Search .............. 250/227.21, 227.23, 250/225, 231.1, 227.17-227.18; 374/131, 161; 324/96, 244, 244 OP; 350/374, 376, 378, 384, 389

[56] References Cited

U.S. PATENT DOCUMENTS

| | | | |
|---|---|---|---|
| 4,071,751 | 1/1978 | Waksberg | 250/225 |
| 4,094,581 | 6/1978 | Baldwin et al. | 350/389 |
| 4,539,521 | 9/1985 | Matsumoto | 324/244 |
| 4,563,093 | 1/1986 | Tada et al. | 324/96 |
| 4,563,639 | 1/1986 | Langeac | 374/131 |
| 4,563,646 | 1/1986 | Desormiere | 324/244 |
| 4,581,579 | 4/1986 | Nagatsuma et al. | 324/244 OP |
| 4,604,577 | 8/1986 | Matsumura et al. | 324/244 OP |
| 4,613,811 | 9/1986 | Vaerewyck et al. | 324/96 |
| 4,683,421 | 7/1987 | Miller et al. | 250/225 |
| 4,774,406 | 9/1988 | Chollet et al. | 250/227 |
| 4,814,930 | 3/1989 | Abe et al. | 250/227.21 |
| 4,956,607 | 9/1990 | Abe et al. | 324/96 |

OTHER PUBLICATIONS

"Fiber-Optic Instrument for Temperature Measurement", by Kyuma et al., IEEE Journal of Quantum Electronics, vol. QE-18, No. 4, Apr. 1982.

*Primary Examiner*—David C. Nelms
*Assistant Examiner*—Michael Messinger
*Attorney, Agent, or Firm*—Parkhurst, Wendel & Rossi

[57] ABSTRACT

An instrument including a light-emitter for emitting a light beam, a sensing head portion through which the light beam is transmitted, a light-detective element receiving the beam from the head portion, and a detector receiving an electric signal from the light-detective element. The head portion has a thermo-optical element for changing a first component of the light beam with an ambient temperature, and an optical element for changing a second component of the beam with an electric quantity. The electric signal produced by the light-detective element has a first and a second component which correspond to the first and second components of the light beam, respectively. The detector determines the ambient temperature based on the first component of the electric signal, and determines the electric quantity based on the second component of the electric signal. The electric quantity may be an AC magnetic field, a current, an AC electric field or a voltage.

11 Claims, 7 Drawing Sheets

INSTRUMENT FOR CONCURRENTLY OPTICALLY MEASURING THERMAL AND ELECTRIC QUANTITIES

BACKGROUND OF THE INVENTION

1. Field of the Invention

The present invention relates in general to an optical measuring apparatus or instrument adapted to measure or determine electric quantities such as quantities of current, magnetic field, voltage and electric field associated with power transmission and distribution lines, electric wirings and other electric parts, and an ambient temperature of these components, by utilizing a beam of light as a medium for the measurement. More particularly, the invention is concerned with such an optical measuring instrument capable of concurrently measuring or determining a temperature and at least one electric quantity.

2. Discussion of the Prior Art

In recent years, optical measurement utilizing a light beam as a medium having high degrees of insulation and freedom from electromagnetic induction noises has been drawing growing attention of the industries concerned with the art of power transmission and distribution, for measuring or determining an electric current, a magnetic field strength, a voltage, an electric field strength or other electric quantity associated with power transmission and distribution lines, together with the ambient temperature. Examples of such optical measuring instruments recently proposed include optical voltage/electric-field sensors utilizing a Pockel's effect, optical current/magnetic-field sensors utilizing a Faraday effect, temperature sensors of optical path shielding type adapted to shield an optical path with a shielding ratio changing depending upon the ambient temperature, and temperature sensors of optical intensity modulation type adapted to change an amount of light beam transmitted through a substance placed on an optical path, depending upon the ambient temperature.

In the field of electric power transmission and distribution, facilities for transmitting and distributing electric power are becoming more and more large-sized and complicated, to meet a recent increasing demand for the electric power and a recent growing need for power distribution to an increasing number of points of consumption per unit area. Accordingly, monitoring of the power transmission and distribution lines is becoming more and more important. To this end, there is an increasing requirement for obtaining useful information concerning the conditions of the power transmission and distribution lines.

Conventional optical measuring sensors are a single-purpose sensor adapted to measure or determine only one physical quantity. If there are two or more or many physical quantities to be measured, the number of optical sensors required accordingly increases. This makes it difficult to provide a compact measuring instrument or apparatus capable of measuring two or more quantities.

Although a measuring instrument may accommodate in a relatively compact fashion a plurality of sensors disposed in parallel with each other, the compactness of the instrument is undesirably limited since the individual sensors are structurally independent of each other. Further, the number of optical paths along which a measuring light beam from the sensing head portion of each sensor is propagated to the light-sensitive portion of the sensor is equal to the number of the sensors. This results in a relatively large number of optical fibers, which are widely used as the optical paths in the fields of power transmission and distribution. Where the optical fibers are supported extending through ceramic insulators, the durability of the ceramic insulators is deteriorated, for example.

In the above case where a relatively large number of optical fibers are used for directing the measuring light beams from respective sensors, the required size of holes formed through the ceramic insulators for supporting the optical fibers must be accordingly large. The increased size of the holes causes reduced strength of the insulators, leading to easy structural deterioration or breakage of the insulators.

SUMMARY OF THE INVENTION

The present invention was developed in view of the above situation in the prior art. It is therefore an object of the present invention to provide an optical measuring instrument capable of concurrently measuring a temperature, and at least one electric quantity such as a voltage, an electric field strength, a current and a magnetic field strength, by using a single optical path for directing a measuring light beam from a sensing head portion to a light-detective portion.

The above object may be achieved according to one aspect of the present invention, which provides an optical measuring instrument including a light-emitting portion for emitting a light beam, a sensing head portion through which the light beam is transmitted and which influences the transmitted light beam depending upon a physical quantity to be measured, a light-detective portion receiving the light beam transmitted through the sensing portion and producing an electric signal corresponding to the received light beam, and a detecting portion for retrieving a component of the electric signal which changes with the physical quantity, to determine the physical quantity. The sensing head portion includes thermo-optical changing means for changing a first component of the transmitted light beam with an ambient temperature, and electro-optical changing means for changing a second component of the transmitted light beam with an electric quantity. The light-detective portion produces an electric signal having a first and a second component which correspond to the first and second components of the transmitted light beam, respectively. The detecting portion includes means for retrieving the first component of the electric signal and thereby determining the ambient temperature, and means for retrieving the second component of the electric signal and thereby determining the electric quantity.

A preferred combination of the thermo-optical changing means and the electro-optical changing means may be a combination of means for changing a quantity of the light beam transmitted therethrough, with a change in the ambient temperature, and an optical element which has at least one of the Pockel's effect and the Faraday effect, for example.

The above object may also be achieved according to another aspect of this invention, which provides an optical measuring instrument comprising: (a) a light-emitting portion for emitting a light beam; (b) a sensing head portion including a Faraday-effect element having the Faraday effect, a rotatory element having a rotatory power dependent on a temperature and disposed in series with the Faraday-effect element, a polarizer disposed between the light-emitting portion and a series of the Faraday-effect element and the rotatory element, and an analyzer receiving the light beam transmitted through the polarizer, the Faraday-effect element and the rotatory element, the light beam being modulated by the Faraday-effect and rotatory elements by an ambient temperature thereof and an AC magnetic field applied thereto; (c) a light-detective portion receiving the light beam modulated by the sensing head portion and producing an electric signal corresponding to the received light beam; (d) first-component selecting means for selecting a first component ($P\omega$) of the electric signal which has a same angular frequency as that of the AC magnetic field, a strength of the AC magnetic field or an amount of an electric current which produces the AC magnetic field being determined based on the first component ($P\omega$) of the electric signal; (e) second-component selecting means for selecting a second component ($P_{2\omega}$) of the electric signal which has an angular frequency which is two times that of the AC magnetic field; and (f) ratio calculating means for calculating a ratio ($P_{2\omega}/P\omega^2$) of the second component ($P_{2\omega}$) to the first component ($P\omega$) raised to the second power. The ambient temperature is determined based on the ratio ($P_{2\omega}/P\omega^2$) calculated by the ratio calculating means.

In the above optical measuring instrument for measuring the ambient temperature and the AC magnetic field or the electric current which produces the magnetic field, the Faraday-effect element and the rotatory element having a rotatory power dependent upon a temperature may be replaced by a single optical element which has the Faraday-effect and a rotatory power dependent upon a temperature.

The same object may be accomplished according to a further aspect of the present invention, which provides an optical measuring instrument comprising: (a) a light-emitting portion for emitting a light beam; (b) a sensing head portion including a Pockel's-effect element having the Pockel's effect, a retardation element doubly refracting the light beam or effecting birefringence of the light beam depending upon a temperature and disposed in series with the Pockel's-effect element, a polarizer disposed between the light-emitting portion and a series of the Pockel's-effect element and the retardation element, to receive the light beam, and an analyzer receiving the light beam transmitted through the polarizer, the Pockel's-effect element and the retardation element, the light beam being modulated by the Pockel's-effect and retardation elements by an ambient temperature thereof and an AC electric field applied thereto; (c) a light-detective portion receiving the light beam modulated by the sensing head portion and producing an electric signal corresponding to the received light beam; (d) first-component selecting means for selecting a first component ($P\omega$) of the electric signal which has a same angular frequency as that of the AC electric field, a strength of the AC electric field or a magnitude of voltage which produces the AC electric field being determined based on the first component ($P\omega$) of the electric signal; (e) second-component selecting means for selecting a second component ($P_{2\omega}$) of the electric signal which has an angular frequency which is two times that of the AC electric field; and (f) ratio calculating means for calculating a ratio ($P_{2\omega}/P\omega^2$) of the second component ($P_{2\omega}$) to the first component ($P\omega$) raised to the second power. The ambient temperature is determined based on the ratio ($P_{2\omega}/P\omega^2$) calculated by the ratio calculating means.

In the above optical measuring instrument for measuring the ambient temperature and the AC electric field or the voltage which produces the electric field, the Pockel's-effect element and the retardation element effecting birefringence of the light beam depending upon a temperature may be replaced by a single optical element which has the Pockel's-effect and functions as a retardation element for effecting birefringence of the light beam depending upon a temperature.

In the various forms of the optical measuring instrument constructed according to the principle of the present invention, only a single optical path is required for directing the light beam from the light-emitting portion of the sensing head to the light-detective portion, for concurrently determining the ambient temperature and an electric quantity or quantities. Therefore, most of the components of the instrument such as the light-emitting and light-detective portions of the sensing head are commonly used for determining the temperature and the electric quantity. Accordingly, the present optical measuring instrument is considerably small-sized and made compact, as compared with the conventional instrument having a housing which merely accommodates the individual sensors for determining the respective physical quantities. Further, the cost of manufacture of the instrument per one physical quantity to be measured is significantly lowered. Where an optical fiber is used to define an optical path between the sensing head and the light-detective portion, the arrangement of the present optical measuring instrument overcomes the conventionally encountered deterioration of the durability of the ceramic insulators, which may arise from relatively large holes formed through the insulators for supporting or holding a relatively large number of optical fibers used in the conventional instrument.

BRIEF DESCRIPTION OF THE DRAWINGS

With the above as background, reference should now be made to the following detailed description of the preferred embodiments and the accompanying drawings, in which.

DETAILED DESCRIPTION OF THE PREFERRED EMBODIMENTS

Figure 1:
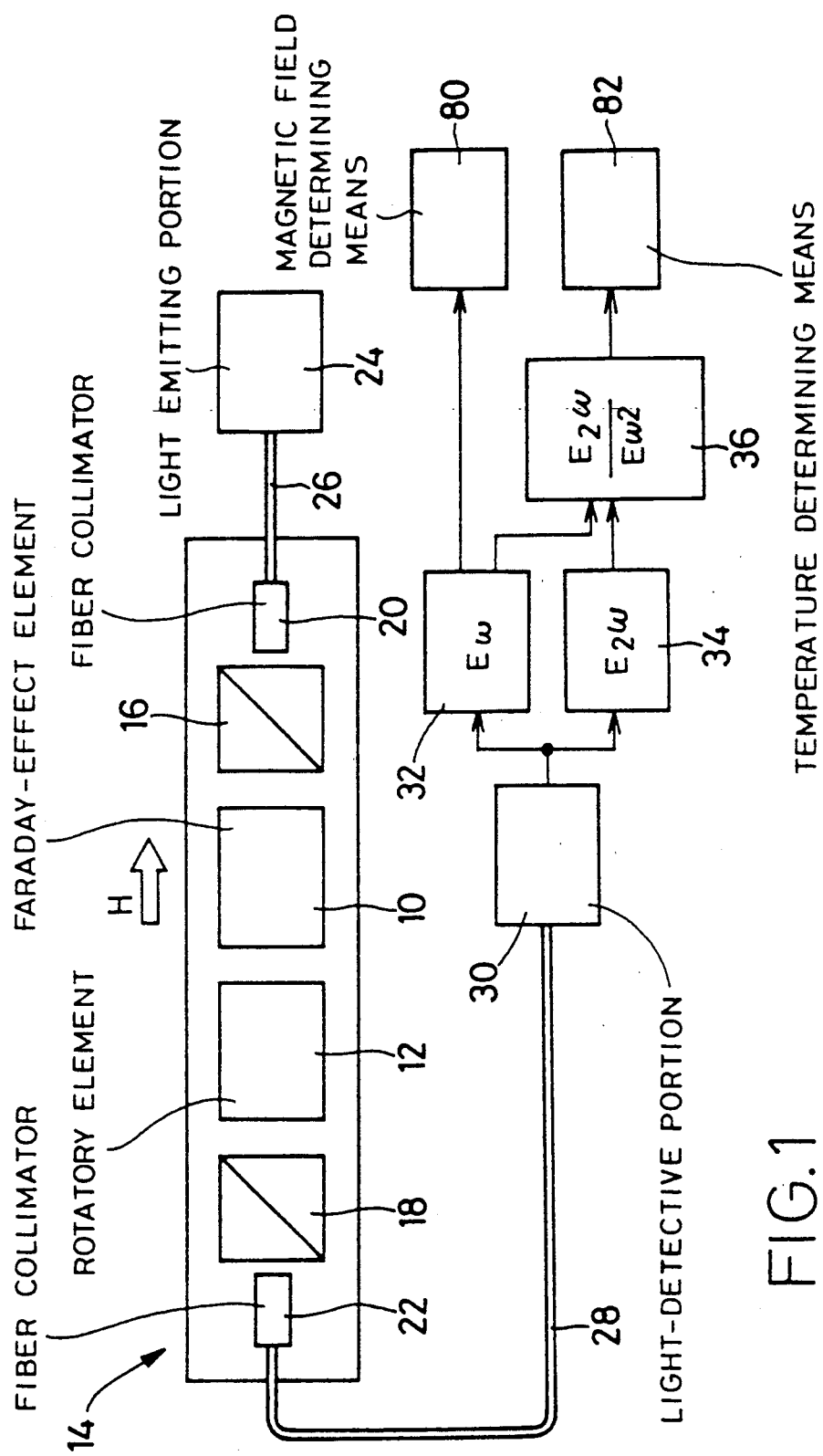
FIG. 1 is a schematic diagram of an optical measuring instrument in accordance with the invention that utilizes a Faraday-effect element as an electro-optical changing means and a rotatory element as a thermo-optical changing means.

In the following description, there will be first described an optical measuring instrument which is adapted to determine the ambient temperature, and the strength of a magnetic field or an amount of electric current producing the magnetic field, by using electro-optical changing means in the form of a Faraday-effect element having the Faraday effect, and thermo-optical changing means in the form of a rotatory element having a rotatory power dependent upon a temperature. Then, the description refers to an optical measuring instrument adapted to determine the ambient temperature, and the strength of an electric field or the magnitude of voltage producing the electric field, by using the electro-optical changing means in the form of a Pockel's-effect element having the Pockel's effect, and the thermo-optical changing means in the form of a retardation element effecting birefringence of a light beam or doubly refracting a light beam depending upon a temperature. Then, there will be described an optical measuring instrument which is constructed to determine the ambient temperature and the magnetic field strength and which uses the thermo-optical changing means adapted to change the amount of light beam transmitted therethrough depending upon the ambient temperature, and uses the Faraday-effect element as the electro-optical changing means. Finally, there will be described an optical measuring instrument which is constructed to determine the ambient temperature, the magnetic field strength and voltage magnitude and which uses the thermo-optical changing means adapted to change the amount of light beam transmitted therethrough depending upon the ambient temperature, and uses as the electro-optical changing means an optical element which has both the Faraday effect and the Pockel's effect.

The term "Faraday effect" is interpreted to mean rotation of the plane of polarization of a plane-polarized light passing through a Faraday-effect element, by an angle corresponding to the strength of a magnetic field applied to the Faraday-effect element. The Faraday-effect element having the Faraday effect may be formed of a material such as YIG, $Bi_{12}SiO_{20}$, $Bi_{12}GeO_{20}$, ZnSe and lead glass. The term "Pockel's effect" is interpreted to mean phase modulation of a light passing through a Pockel's-effect element, by an amount corresponding to the strength of an electric field applied to the Pockel's-effect element. The Pockel's-effect element may be formed of a material such as $LiNbO_3$, $LiTaO_3$, $Bi_{12}SiO_{20}$ and $Bi_{12}GeO_{20}$.

The "rotatory element" is an optical element which has a rotatory power, i.e., capability of rotating the plane of polarization of a polarized radiation or beam. The rotatory element may be formed of a material such as rock crystal, $Bi_{12}SiO_{20}$ and $Bi_{12}GeO_{20}$. The "retardation element" is an optical element capable of effecting birefringence of a light beam or doubly refracting a light beam, and may be formed of a material such as rock crystal, $LiNbO_3$ and $LiTaO_3$. The Faraday-effect element which also has a function of the rotatory element may be formed of a material such as $Bi_{12}SiO_{20}$ and $Bi_{12}GeO_{20}$. Further, the Pockel's-effect element which also has a function of the retardation element may be formed of $LiNbO_3$ and $LiTaO_3$. The optical element having both of the Faraday effect and the Pockel's effect may be formed of a material such as $Bi_{12}SiO_{20}$ and $Bi_{12}GeO_{20}$.

Referring first to FIG. 1, there is shown an optical measuring instrument which is capable of concurrently determining the strength of a magnetic field or an amount of electric current producing the magnetic field, by using as electro-optical changing means a Faraday-effect element 10, and as thermo-optical changing means a rotatory element 12 which has a rotatory power dependent upon a temperature.

In FIG. 1, reference numeral 14 denotes a sensing head portion of the instrument, which incorporates the Faraday-effect element 10 and the rotatory element 12 disposed in series such that the Faraday-effect element 10 is upstream of the rotatory element 12 in the direction of propagation of a light beam through the sensing head. A polarizer 16 and an analyzer 18 are disposed on opposite sides of a series of the elements 10 and 12 as viewed in the direction of propagation such that the polarizer 16 is adjacent to the Faraday-effect element 10 while the analyzer 18 is adjacent to the rotatory element 12. The sensing head 14 further incorporates fiber collimators 20, 22 optically coupled to the polarizer 16 and analyzer 18, respectively. The measuring instrument includes a light-emitting portion 24 for producing a light beam having a predetermined intensity. The light beam emitted from the light-emitting portion 24 is directed to the fiber collimator 20 through an incoming optical fiber 26, and is incident upon the sensing head portion 14, for transmission through the polarizer 16, Faraday-effect element 10, rotatory element 12 and analyzer 18 in the order of description. The light beam emitted from the analyzer 18 is incident upon the fiber collimator 22 and is emitted therefrom.

The light source of the light-emitting portion 24 generally uses a light-emitting diode, but may use a He-Ne or other laser.

An angle of rotation $\phi$ of the plane of polarization of the light beam transmitted through the Faraday-effect 10 is represented by the following equation (1) as well known in the art:

$$\phi = v \cdot H \cdot L \qquad (1)$$

where, v: Verdet's constant of the element 10
H: AC magnetic field applied to the element 10, as an electric quantity to be measured
L: length of the element 10

Therefore, an intensity P of the output light beam transmitted through the sensing head portion 14 and emitted from the fiber collimator 22 is represented by the following equation (2):

$$\begin{aligned} P &= cP_0\cos^2(\Phi + \theta) \\ &= cP_0\cos^2(vLH + \theta) \\ &= cP_0\cos^2(vLH_0\sin\omega t + \theta) \end{aligned} \qquad (2)$$

where,
$\theta = \theta_0 + \phi$
$\phi$: angle of rotation of the polarization plane of the light beam transmitted through the rotatory element 12
$\theta_0$: relative angular difference between the polarizer 16 and the analyzer 18
c: proportion constant $P_0$: intensity of the incident beam
$H_0$: amplitude of the AC magnetic field H
$\omega$: angular frequency of the AC magnetic field H
t: time
Where the value $vLH_0$ is sufficiently smaller than 1, the above equation (2) is converted into the following equation (3):

$$P = \frac{cP_0}{2} \{1 + \cos2\theta - 2vLH_0\sin\omega t \cdot \sin2\theta + (vLH_0)^2 \cdot \cos2\omega t \cdot \cos2\theta\} \quad (3)$$

Hence, the intensity P of the light beam emitted from the sensing head portion 14 is represented by a functional equation which includes a component $P\omega$ having the same angular frequency $\omega$ as that of the applied AC magnetic field H, and a component $P_{2\omega}$ having an angular frequency $2\omega$ which is two times that of the AC magnetic field H.

The output light beam emitted from the sensing head portion 14 through the fiber collimator 22 is directed to a light-detective portion 30 of the instrument through an optical fiber 28, as shown in FIG. 1. The light-detective portion 30, which may consist of a photodiode, converts the received light beam into an electric signal E corresponding to the intensity P of the light beam. The electric signal E is applied to first-component selecting means in the form of a first component detector 32, and to second-component selecting means in the form of a second component detector 34. That is, the light-detective portion 30 produces the electric signal E which corresponds to the light beam intensity P and which is represented by the following equation (3'):

$$E = \frac{cE_0}{2} \{1 + \cos2\theta - 2vLH_0\sin\omega t \cdot \sin2\theta + (vLH_0)^2 \cdot \cos2\omega t \cdot \cos2\theta\} \quad (3')$$

where,
$E_0$: amplitude of the electric signal E

The first component detector 32 is constituted by an electric filter, a phase detecting circuit or other suitable means, and is adapted to select the first component $E\omega$ ($P\omega$) of the electric signal E which has the same angular frequency $\omega$ as that of the applied AC magnetic field H (electric quantity to be determined). On the other hand, the second component detector 34 is constituted by suitable means similar to the detector 32, and is adapted to select the second component $E_{2\omega}$ ($P_{2\omega}$) of the electric signal E which has the angular frequency $2\omega$ which is two times that of the applied AC magnetic field H. Thus, the first component $E\omega$ of the electric signal E selected by the first component detector 32 is represented by the following equation (4), while the second component $E_{2\omega}$ selected by the second component detector 34 is represented by the following equation (5):

$$E\omega = cE_0vLH_0 \cdot \sin2\theta \quad (4)$$

$$E_{2\omega} = \frac{cE_0}{2}(vLH_0)^2 \cdot \cos2\theta \quad (5)$$

It will be understood from the above equation (4) that the first component $E\omega$ which is detected by the first component detector 32 and which has the same angular frequency as that of the AC magnetic field H is proportional to the amplitude $H_0$ of the magnetic field. Therefore, the amplitude $H_0$ of the applied AC magnetic field H can be determined by the first component $E\omega$ of the electric signal E selected by the first component detector 32. Further, an amount of electric current which produces the AC magnetic field H having the amplitude $H_0$ can be determined by the first component $E\omega$.

As indicated in FIG. 1, the first and second components $E\omega$ and $E_{2\omega}$ selected by the respective first and second component detectors 32, 34 are both applied to ratio calculating means in the form of a ratio calculator 36. This ratio calculator 36 calculates a ratio $E\tau$ ($P\tau$) of the second component $E_{2\omega}$ to the first component $E\omega$ raised to the second power, according to the following equation (6):

$$E\tau = E_{2\omega}/E\omega^2 = \frac{(vLH_0)^2\cos2\theta}{4(vLH_0)^2\sin^22\theta} = \frac{\cos2\theta}{4\sin^22\theta} \quad (6)$$

The rotation angle $\phi$ of the polarization plane of the light beam transmitted through the rotatory element 12 of the sensing head portion 14 has dependence on the ambient temperature, and may be approximated by the following linear functional equation (7):

$$\phi = \phi_0 + \delta\phi \cdot T \quad (7)$$

where,
T: ambient temperature of the sensing head portion 14
$\phi_0$: rotation angle of the beam by the rotatory element 12 at room temperature
$\delta\phi$: temperature coefficient of the element 12

Therefore, the value $\theta$ in the above equation (6) is represented by the following equation (8):

$$\theta = \theta_0 + \phi_0\delta\phi \cdot T \quad (8)$$

It will therefore be understood that the ratio $E\tau$ obtained by the ratio calculator 36 is expressed as a function of the ambient temperature T. Namely, the ambient temperature T of the sensing head portion 14 (rotatory element 12) can be determined by the ratio $E\tau$ ($E_{2\omega}/E\omega^2$) obtained by the calculator 36.

The output (first component $E\omega$ of the electric signal E) of the first component detector 32 is applied to magnetic field determining means 80, so that the amplitude $H_0$ of the AC magnetic field H applied to the Faraday-effect element 10 is determined by the determining means 80, based on the received output $E\omega$ of the first component detector 32. On the other hand, the output $E\tau$ ($E_{2\omega}/E\omega^2$) of the ratio calculator 36 is applied to temperature determining means 82, so that the ambient temperature T of the sensing head portion 14 is determined by the determining means 82, based on the received output $E\tau$ of the ratio calculator 36. The magnetic field determining means 80 and the temperature determining means 82 may be part of the instant optical measuring instrument, or may be part of an external or separate device.

It will be understood from the above description of the present embodiment of the optical measuring instrument that only one optical fiber 28 is used for directing the measuring light beam from the sensing head portion 14 to the light-detective portion 30, for concurrently determining or measuring the ambient temperature and the strength of the magnetic field or the corresponding amount of electric current. Accordingly, the size or diameter of the holes formed through fiber supporting ceramic insulators can be made comparatively small, since the single optical fiber 28 extends through the holes, even where the measuring instrument is adapted to determine two or more physical quantities, i.e., magnetic field strength of power transmission or distribution lines, and the ambient temperature of the sensing head portion 14 of the instrument. Consequently, the durability of the ceramic insulators is significantly improved.

Further, the light-emitting portion 24, optical fibers 26, 28 and light-detective portion 30 are used commonly for the optical determination of the ambient temperature by utilizing the rotatory element 12, and for the optical determination of the magnetic field or electric current by utilizing the Faraday-effect element 10. In addition, a part of the detecting portion consisting of the detectors 32, 34 and calculator 36 is also used commonly for the determinations of the temperature and magnetic field strength or current. Accordingly, the instant optical measuring instrument can be made considerably small-sized and compact, and the cost of manufacture of the instrument can be significantly lowered.

In the optical measuring instrument, the Faraday-effect element 10 and the rotatory element 12 can be positioned such that the rotatory element 12 is upstream of the Faraday-effect element 10 in the direction of propagation of the light beam through the sensing head portion 14. Namely, the Faraday-effect element 10 is disposed between the rotatory element 12 and the analyzer 18 while the rotatory element 12 is disposed between the Faraday-effect element 10 and the polarizer 16.

Figure 2:
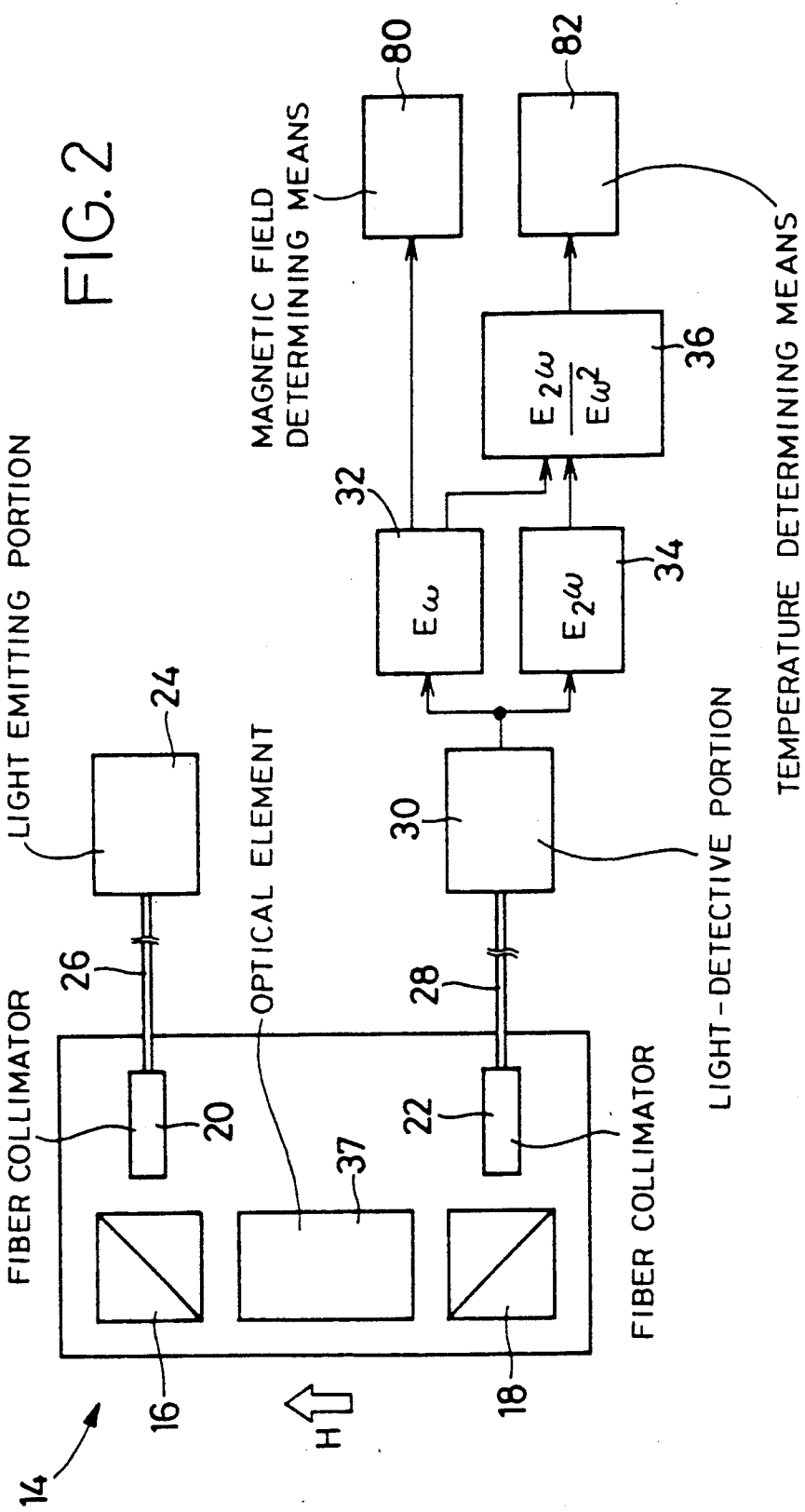
FIG. 2 is a schematic diagram of an optical measuring instrument in accordance with the invention that replaces the Faraday-effect element and a rotatory element shown in FIG. 1 with a single optical element.

Further, the combination of the Faraday-effect element 10 and the rotatory element 12 may be replaced by a single optical element 37, as indicated in FIG. 2, which element 37 has the Faraday effect and a rotatory power dependent on a temperature. Moreover, the following equation (9) may be used by the ratio calculator 36 to calculate the ratio $E\tau$ ($P\tau$) of the first component $E\omega$ raised to the second power to the first component $E_{2\omega}$ to the second power to the first power:

$$E\tau = E\omega^2/E_{2\omega} = \frac{4(\nu L H_0)^2 \sin^2 2\theta}{(\nu L H_0)^2 \cos 2\theta} = \frac{4\sin^2 2\theta}{\cos 2\theta} \quad (9)$$

Figure 3:
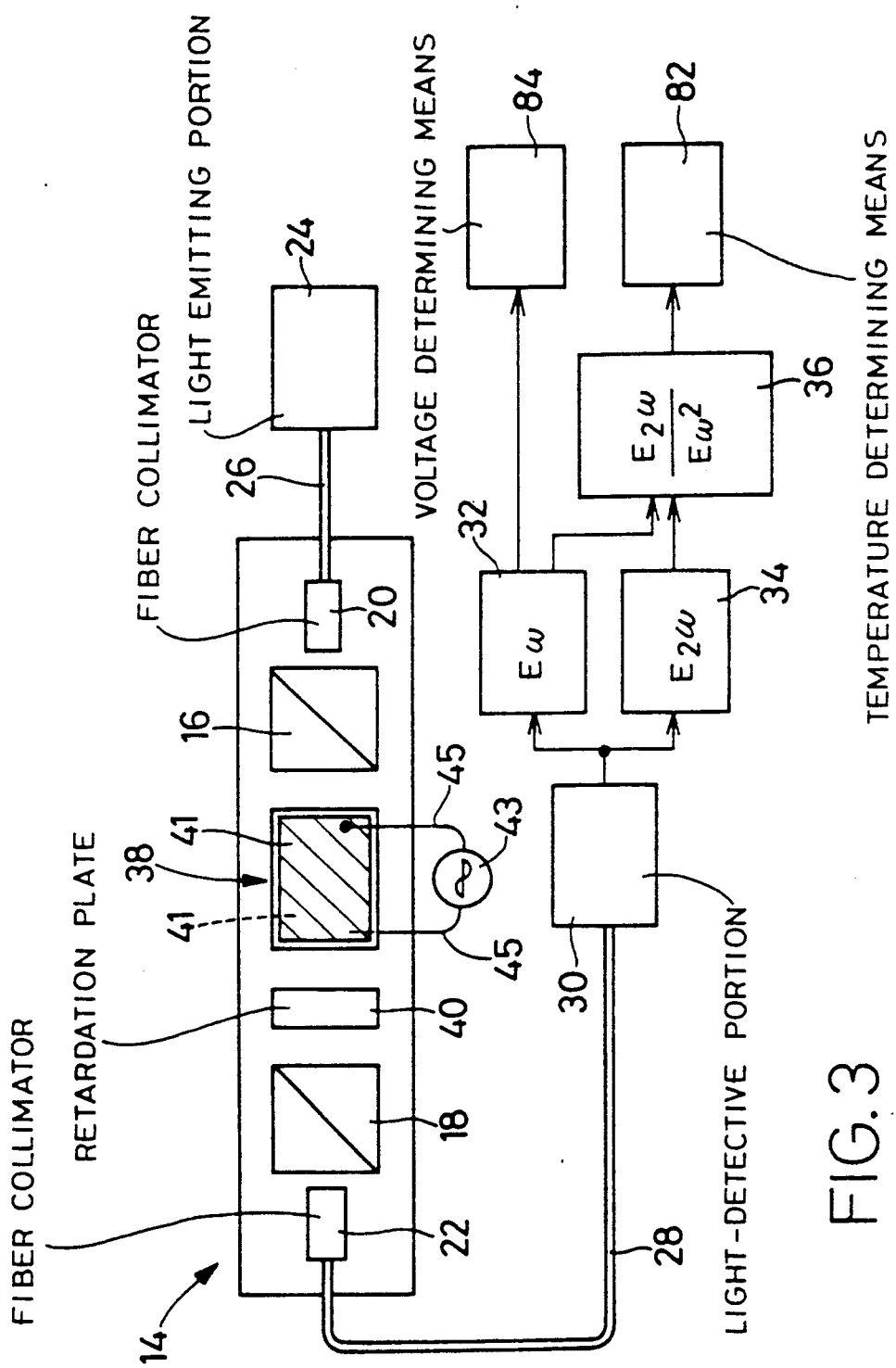
FIG. 3 is a schematic diagram of an optical measuring instrument in accordance with the invention that utilizes a Pockel's effect element as an electro-optical changing means and a retardation element as a thermo-optical changing means.

Referring next to FIG. 3, there is shown an optical measuring instrument adapted to concurrently determine a temperature and a voltage magnitude (strength of an electric field), by using a Pockel's-effect element as the electro-optical changing means, and a retardation element as the thermo-optical changing means for doubly refracting a light beam depending upon a temperature. This measuring instrument of FIG. 3 is identical with the instrument of FIG. 1, except that a Pockel's-effect element 38 is substituted for the Faraday-effect element 10 of FIG. 1, while a retardation plate 40 as the retardation element is substituted for the rotatory element 12 of FIG. 1. The following description principally refers to the operating principle to determine the voltage magnitude and temperature.

The Pockel's-effect element 38 has a pair of electrodes 41, 41 formed on its opposite faces which are opposed to each other in a direction perpendicular to the direction of propagation of the light beam through the sensing head portion 14. A voltage source 43 is electrically connected to these electrodes 41 through lead wires 45, 45, so that a voltage V is applied between the electrodes 41. As a result, a light beam transmitted through the Pockel's-effect element 38 undergoes optical retardation $\phi$. The amount of this retardation $\phi$ is represented by the following equation (10):

$$\phi = (\pi/V\pi) \cdot V \quad (10)$$

where,
$V\pi$: half-wave voltage

The intensity P of the light beam emitted from the fiber collimator 22 of the sensing head portion 14 where the relative angular difference $\theta_0$ between the polarizer 16 and the analyzer 18 is 0° is represented by the following equation (11):

$$\begin{aligned}
P &= cP_0 \cos^2\{(\Phi + \theta)/2\} \\
&= \frac{cP_0}{2} [1 + \cos\{(\pi/V\pi)V + \theta\}] \\
&= \frac{cP_0}{2} [1 + \cos\{(\pi/V\pi)V\} \cdot \cos\theta - \sin\{(\pi/V\pi)V\} \cdot \sin\theta] \\
&= \frac{cP_0}{2} [1 + \cos\theta - (\pi/V\pi)V_0 \sin\omega t \cdot \sin\theta + \\
&\quad (1/4) \cdot (\pi/V\pi)^2 V_0^2 \cos 2\omega t \cdot \cos\theta]
\end{aligned} \quad (11)$$

where,
$\theta$: optical bias given by the retardation plate 40
$P_0$: intensity of the light beam incident upon the sensing head portion 14
c: proportion constant
$V_0$: amplitude of the applied voltage V
$\omega$: angular frequency of the applied voltage V
t: time As in the embodiments of FIGS. 1 and 2 adapted to determine the ambient temperature and the magnetic field strength, the intensity P of the light team transmitted through the sensing head portion 14 is represented by a functional equation which includes a component $P\omega$ having the same angular frequency $\omega$ as that of the applied voltage V, and a component $P_{2\omega}$ having an angular frequency $2\omega$ which is two times that of the applied voltage V.

The light beam emitted from the sensing head portion 14 of the present embodiment of FIG. 3 is also directed through the optical fiber 28 to the light-detective portion 30, so that the light beam is converted into a corresponding electric signal E. The signal E is applied to the first and second component detectors 32, 34, so that the first component $E\omega$ ($P\omega$) of the signal E having the same angular frequency $\omega$ as that of the applied voltage V is selected by the first component detector 32, while the second component $E_{2\omega}$ ($P_{2\omega}$) having the angular frequency $2\omega$ which is two times that of the voltage V is selected by the second component detector 34. The first and second components $E\omega$ and $E_{2\omega}$ are represented by the following equations (12) and (13), respectively:

$$E\omega = \frac{cE_0}{2} (\pi/V\pi) V_0 \sin\theta \quad (12)$$

$$E_{2\omega} = \frac{cE_0}{2} (1/4) \cdot (\pi/V\pi)^2 V_0^2 \cdot \cos\theta \quad (13)$$

It will be apparent from the above equation (12) that since the first component $E\omega$ of the electric signal E selected by the first component detector 32 is expressed as a function of the amplitude $V_0$ of the voltage V applied between the electrodes 41 of the Pockel's-effect element 38, the amplitude $V_0$ of the applied voltage V can be determined by the first component $E\omega$, and the strength of an electric field which is produced by the voltage V can be determined based on the determined amplitude $V_0$.

The first and second components $E\omega$ and $E_{2\omega}$ of the electric signal E which are selected by the respective first and second component detectors 32, 34 are applied to the ratio calculator 36, so that the ratio $E\tau$ ($P\tau$) of the second component $E_{2\omega}$ to the first component $E\omega$ raised to the second power is calculated by the calculator 36 according to the following equation (14):

$$E\tau = E_{2\omega}/E\omega^2 \qquad (14)$$
$$= \frac{(1/4)\cdot(\pi/V\pi)^2 \cdot V_0^2 \cdot \cos\theta}{(\pi/V\pi)^2 \cdot V_0^2 \cdot \sin^2\theta}$$
$$= \frac{\cos\theta}{4\sin^2\theta}$$

The optical bias $\theta$ given by the retardation plate 40 has dependence on the ambient temperature, and may be approximated by the following linear functional equation (15):

$$\theta = \theta_0 + \Delta\theta\cdot T \qquad (15)$$

where,
T: ambient temperature of the sensing head portion 14
$\theta_0$: optical bias at room temperature
$\Delta\theta$: temperature coefficient of the element 40

It will therefore be understood that the ratio $E\tau$ obtained by the ratio calculator 36 is obtained as a function of the ambient temperature T. Namely, the ambient temperature T of the sensing head portion 14 (retardation plate 40) can be determined by the ratio $E\tau$ ($E_{2\omega}/E\omega^2$) obtained by the calculator 36, as in the embodiments of FIGS. 1 and 2.

The output $E\omega$ of the first component detector 32 is applied to voltage determining means 84, so that the amplitude $V_0$ of the voltage V applied to the Pockel's-effect element 38 is determined by the determining means 80, based on the received output $E\omega$ of the first component detector 32. On the other hand, the output $E\tau$ ($E_{2\omega}/E\omega^2$) of the ratio calculator 36 is applied to the temperature determining means 82 as used in the embodiments of FIGS. 1 and 2, so that the ambient temperature T of the sensing head portion 14 is determined by the determining means 82, based on the received output $E\tau$ of the ratio calculator 36. The voltage determining means 80 and the temperature determining means 82 may or may not be part of the instant optical measuring instrument of FIG. 3.

Like the preceding first and second embodiments of FIGS. 1 and 2, this third embodiment uses only one optical fiber 28 for directing the measuring light beam from the sensing head portion 14 to the light-detective portion 30, for concurrently determining or measuring the ambient temperature and the voltage (strength of the corresponding electric field). Accordingly, the size or diameter of the holes formed through the fiber supporting ceramic insulators can be made comparatively small, since the single optical fiber 28 extends through the holes, even where the measuring instrument is adapted to determine two or more physical quantities, i.e., voltage of power transmission or distribution lines and the ambient temperature. Thus, the present optical measuring instrument has significantly improved durability.

In the third embodiment, too, the light-emitting portion 24, optical fibers 26, 28 and light-detective portion 30 are used commonly for the optical determination of the ambient temperature by utilizing the retardation plate 40, and for the optical determination of the voltage (electric field strength) by utilizing the Pockel's-effect element 38. In addition, a part of the detecting portion 32, 34, 36 is also used commonly for the determinations of the temperature and voltage. Accordingly, the instant optical measuring instrument can be made considerably small-sized and compact, and the cost of manufacture of the instrument can be significantly lowered.

Figure 4:
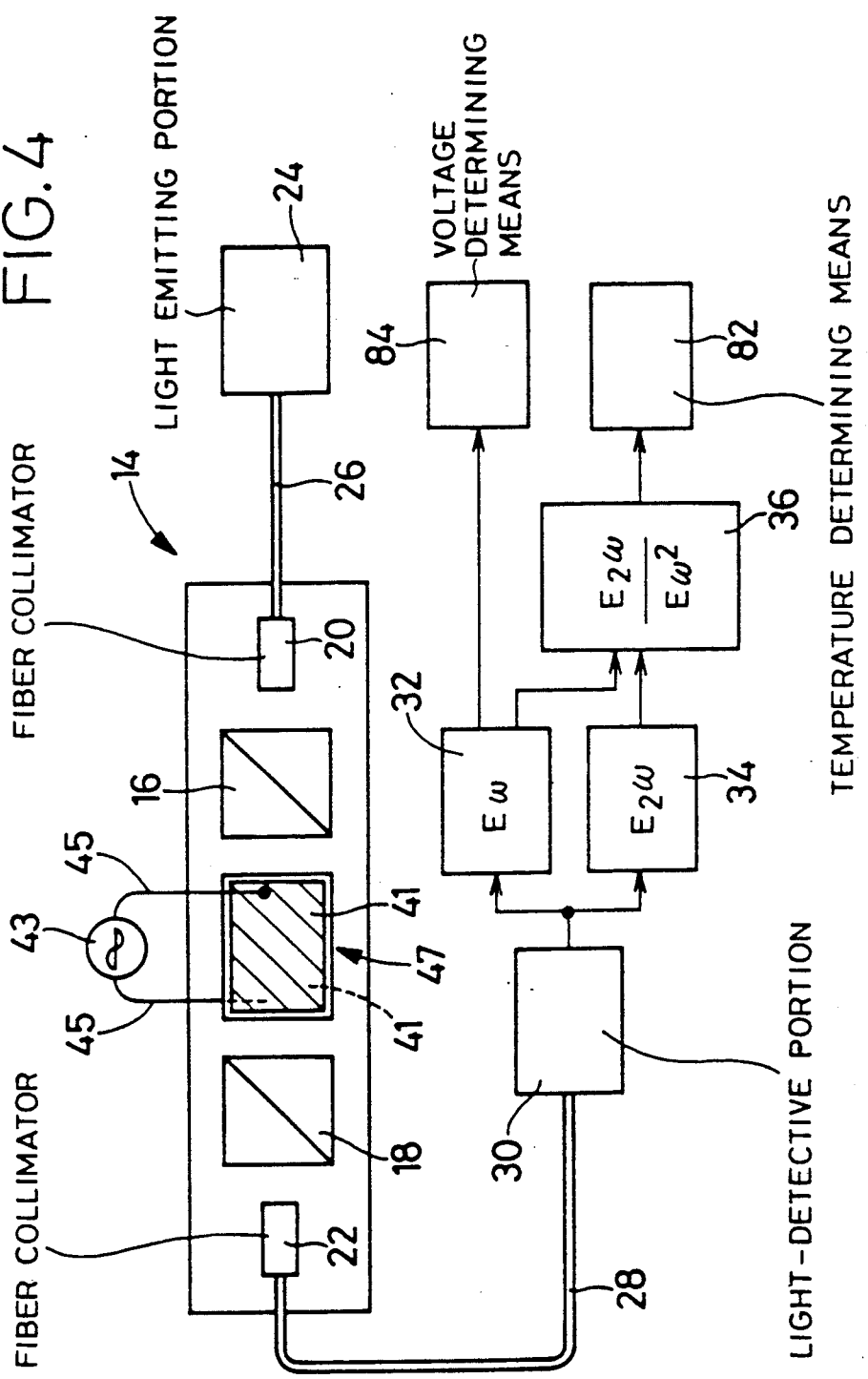
FIG. 4 is a schematic diagram of an optical measuring instrument in accordance with the invention that replaces the Pockel's effect element and the rotary element shown in FIG. 3 with a single optical element.

In the optical measuring instrument of FIG. 3, the Pockel's-effect element 38 and the retardation plate 40 can be positioned such that the retardation plate 40 is upstream of the Pockel's-effect element 38 in the direction of propagation of the light beam through the sensing head portion 14. Further, the combination of the Pockel's-effect element 38 and the retardation plate 40 may be replaced by a single optical element 47, as indicated in FIG. 4, which element 47 has the Pockel's effect and which functions as a retardation plate for effecting birefringence of the light beam depending upon the ambient temperature.

Further, the following equation (16) may be used by the ratio calculator 36 to calculate the ratio $E\tau$ ($P\tau$) of the first component $E\omega$ raised to the second power to the second component $E_{2\omega}$ $$E\tau = E\omega^2/E_{2\omega} = \frac{(\pi/V\pi)^2 \cdot V_0^2 \cdot \sin^2\theta}{(1/4)\cdot(\pi/V\pi)^2 \cdot V_0^2 \cdot \cos\theta} = \frac{4\sin^2\theta}{\cos\theta} \qquad (16)$$

Figure 5:
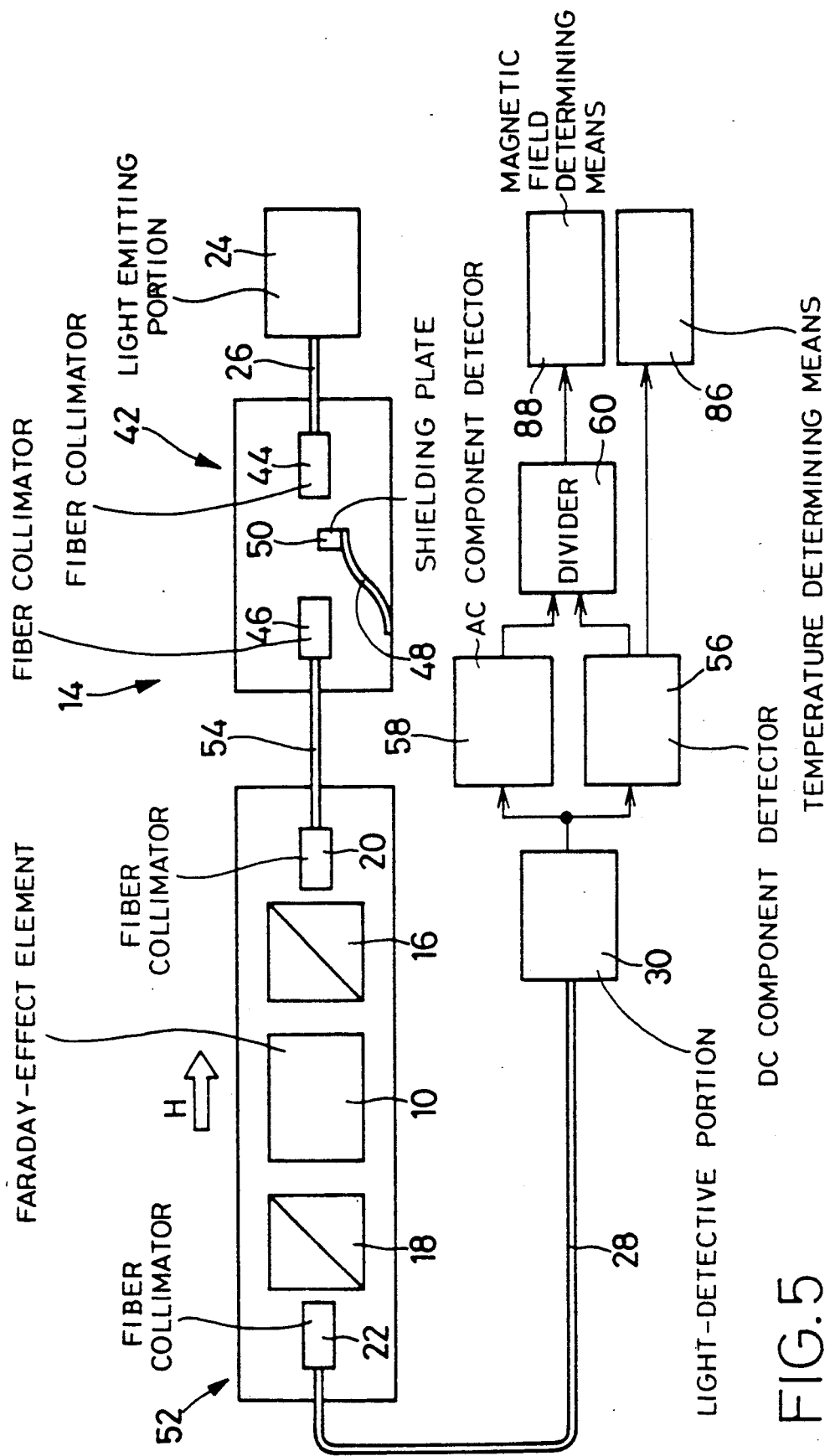
FIG. 5 is a schematic diagram of an optical measuring instrument in accordance with the invention that measures temperature and magnetic field strength.
Figure 6:
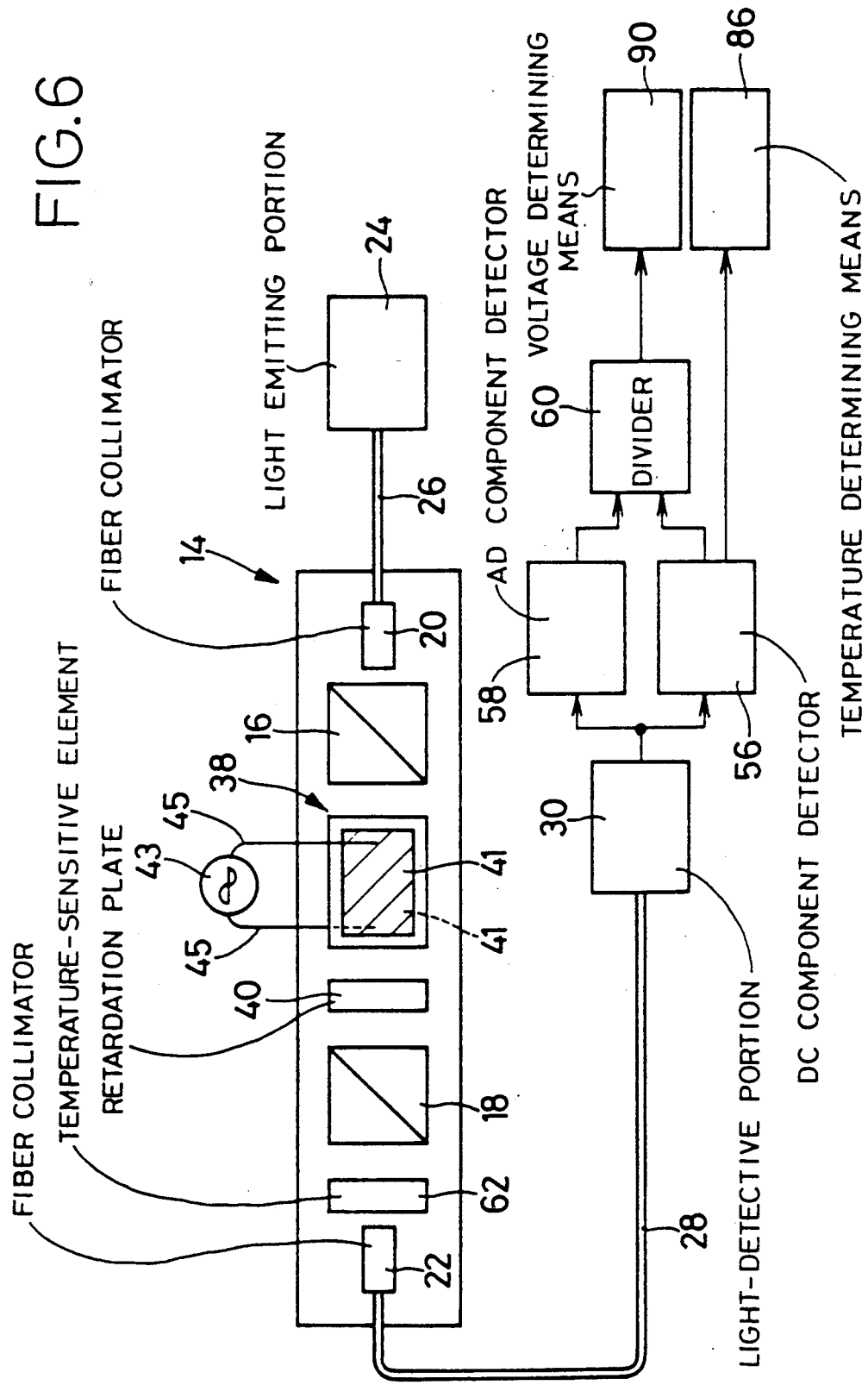
FIG. 6 is a schematic diagram of an optical measuring instrument in accordance with the invention that measures temperature and voltage.
Figure 7:
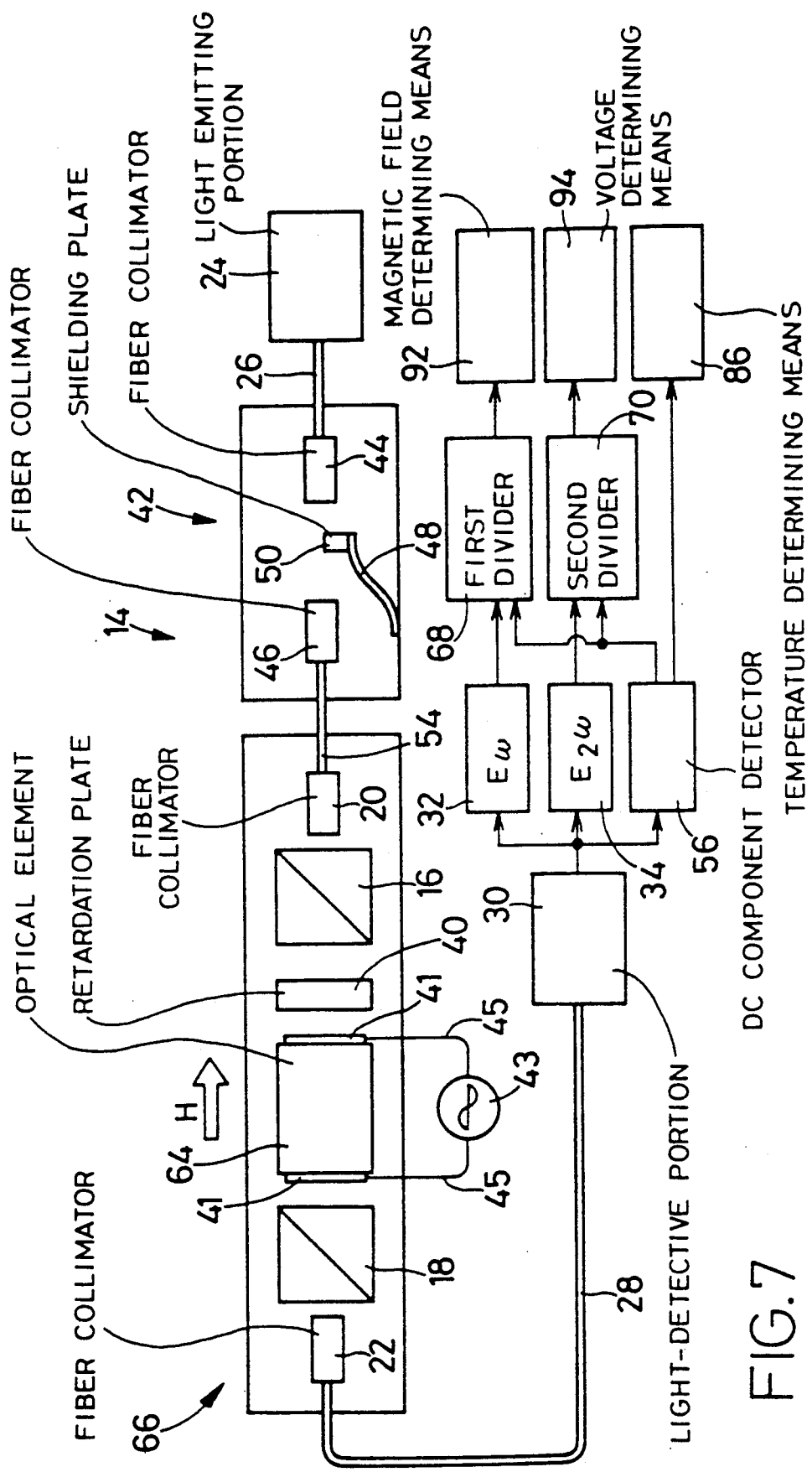
FIG. 7 is a schematic diagram of an optical measuring instrument in accordance with the invention that measures magnetic field strength and voltage.

Referring next to FIGS. 5, 6 and 7, there are shown optical measuring instruments which use thermo-optical changing means capable of changing the amount of a light beam transmitted therethrough depending upon the ambient temperature. The instrument of FIG. 5 is adapted to determine the temperature and a magnetic field strength, and the instrument of FIG. 6 is adapted to determine the temperature and a voltage. The instrument of FIG. 7 is adapted to determine the temperature, a magnetic field strength and a voltage.

In the optical measuring instrument of FIG. 5, a temperature sensing head is indicated generally at 42 in the figure. This temperature sensing head 42 includes a light shielding plate 50 supported by a bimetal 48 such that the shielding plate 50 is disposed between a pair of fiber collimators 44, 46 which are opposed to each other in the direction of propagation of a light beam through the head portion 42.

Reference numeral 52 denotes a magnetic field sensing head 52, which includes the Faraday-effect element 10 disposed between the polarizer 16 and the analyzer 18. The polarizer 16 is disposed between the Faraday-effect element 10, and the fiber collimator 20 optically coupled to the fiber collimator 46 of the temperature sensing head 42 through an optical fiber 54. The analyzer 18 is disposed between the Faraday-effect element 10, and the fiber collimator 22, which is optically coupled to the light-detective portion 30 through the fiber 28. The temperature and magnetic field sensing heads 42, 52 which are optically coupled to each other by the optical fiber 54 constitute the optical sensing head portion 14.

The light-emitting portion 24 is optically coupled through the optical fiber 26 to the fiber collimator 44 of the temperature sensing head 42, so that a light beam produced by the light-emitting portion 24 is incident upon the temperature sensing head 42 through the fiber collimator 44. The incident light beam travels to the fiber collimator 46 passing through a space in which the light shielding plate 50 is disposed. The light beam incident upon the fiber collimator 46 is directed to the magnetic field sensing head 52 through the fiber collimator 20, and transmitted through the polarizer 16, Faraday-effect element 10 and analyzer 18 in the order of description. The light beam is emitted from the magnetic field sensing head 52 through the fiber collimator 22.

The bimetal 48 supporting the light shielding plate 50 is adapted to change the position of the shielding plate 50 depending upon the ambient temperature, thereby changing the amount of the light beam which is transmitted from the fiber collimator 44 to the fiber collimator 46. As a result, the amount of the light beam incident upon the magnetic field head 52 is changed with a variation in the ambient temperature. In the magnetic field sensing head 52, the polarizer 16 and the analyzer 18 are positioned with a predetermined relative angular difference $\theta$. The light beam emitted from the fiber collimator 22 of the magnetic field sensing head 52 has an intensity P which corresponds to the ambient temperature. The intensity P is represented by the above equation (2) or (3).

Suppose the relative angular difference $\theta$ of the polarizer and analyzer 16, 18 is set to 45°, for instance, the intensity P of the light beam emitted from the sensing head portion 14 is represented by the equation (3) and is therefore represented by the following equation (17):

$$P = \frac{cP_0}{2} (1 - 2\nu LH_0 \sin\omega t) \tag{17}$$

Therefore, the DC component of the optical intensity P corresponds to the ambient temperature, while the AC component of the intensity P corresponds to the ambient temperature and the strength of a magnetic field applied to the Faraday-effect element 10.

The light beam which is transmitted through the sensing head portion 14 and directed to the light-detective portion 30 through the fiber 28 is converted by the light-detective portion 30 into a corresponding electric signal E. This electric signal E is applied to a DC component detector 56 and an AC component detector 58, so that the DC component ($cP_0/2$) is selected by the detector 56 while the AC component ($cP_0 \cdot \nu LH_0 \cdot \sin\omega t$) is selected by the detector 58. The selected DC component is applied to a temperature determining means 86, which determines the ambient temperature of the sensing head portion 14, based on the received DC component. On the other hand, the DC and AC components selected by the respective detectors 56, 58 are applied to a divider 60 which divides the AC component by the DC component. A quotient ($2\nu LH_0 \sin\omega t$) obtained by the divider 60, i.e., the output of the divider 60 is applied to a magnetic field determining means 88, so that the amplitude $H_0$ of the magnetic field H applied to the Faraday-effect element 10 is determined based on the output of the divider 60. The determining means 86, 88 may or may not be part of the measuring instrument.

Like the detectors 32, 34 used in the preceding embodiments, the detectors 56, 58 are constituted by an electric filter, phase detecting circuit or other suitable element.

It will be understood that the DC component detector 56 serves as means for selecting the DC component of the electric signal E, while the AC component detector 58 serves as means for selecting the AC component. The DC component detector 56 and the temperature determining means 86 constitute temperature measuring means for selecting the DC component and thereby determining the ambient temperature. The DC and AC component detectors 56, 58, divider 60 and magnetic field determining means 88 constitute magnetic field measuring means for calculating the ratio of the AC component to the DC component and thereby determining the strength of the magnetic field.

It will be understood from the above description that the present measuring instrument using the bimetal 48 and the light shielding plate 50 as the thermo-optical changing means and the Faraday-effect element 10 as the electro-optical changing means uses only one optical fiber 28 for directing the output optical signal of the sensing head portion 14 to the light-detective portion 30. Therefore, the ceramic insulators for supporting the optical fiber 28 have improved durability, and the instrument can be small-sized and compact, for the same reasons as stated above with respect to the first embodiment of FIG. 1.

In the present embodiment, the temperature sensing head 42 and the magnetic field sensing head 52 are coupled by the optical fiber 54. In this arrangement, the point of measurement of the temperature and the point of measurement of the magnetic field strength may be distant from each other.

In the embodiment of FIG. 5, it is possible to determine the amplitude $H_0$ of the magnetic field H based on the AC component of the signal E selected by the AC component detector 58, without using the divider 60. In this case, however, a deflection or flexure of the optical fiber 28 or other defective state of the optical path may cause a variation in the intensity $cP_0$ of the light beam, resulting in an error of measurement of the magnetic field strength. In this sense, the provision of the divider 60 to calculate the ratio of the AC component to the DC component is desirable for enhanced measuring accuracy.

The temperature sensing head 42 and the magnetic field sensing head 52 may be reversed in position along the optical path, or may be disposed adjacent to each other without the use of the optical fiber 54.

The thermo-optical changing means using the light-shielding means 48, 50 for changing the amount of the light beam depending upon the ambient temperature may be replaced by a temperature-sensitive optical element such as GaAs, GaP, CdTe or other material whose transmittance of light changes with the ambient temperature. Further, the thermo-optical changing means may utilize a birefringent material whose optical property changes with the temperature, or a material having a rotatory power dependent upon the temperature. A temperature-sensitive element for changing the intensity of the light beam may also function as a Faraday-effect element.

The optical measuring instrument shown in FIG. 6 adapted to determine a voltage together with the ambient temperature uses the Pockel's-effect element 38 as the electro-optical changing means for converting a voltage into an electric signal. The retardation plate 40 is disposed in series with the Pockel's-effect element 38 such that the Pockel's-effect element 38 is positioned between the polarizer 16 and the retardation plate 40, while the retardation plate 40 is positioned between the Pockel's-effect element 38 and the analyzer 18. The fiber collimator 20 is disposed upstream of the polarizer 16 while a temperature-sensitive element 62 is disposed between the analyzer 18 and the fiber collimator 22. The light transmittance of the temperature-sensitive element 62 changes with the ambient temperature. A voltage V is applied as an electric quantity to be measured, between the electrodes 41, 41 provided on the opposite faces of the Pockel's-effect element 38 which are opposed to each other in a direction perpendicular to the direction of propagation of the light beam through the sensing head portion 14.

The light-emitting portion 24 is connected through the optical fiber 26 to the fiber collimator 22 upstream of the polarizer 16, so that a light beam produced by the light-emitting portion 24 is incident upon the sensing head portion 14 through the fiber collimator 20. The fiber collimator 22 provided downstream of the temperature-sensitive element 62 is connected to the light-detective portion 30 through the optical fiber 28, so that the intensity P of the light beam emitted from the sensing head portion 14 is converted into a corresponding electric signal E.

Suppose the optical bias or retardation $\theta$ given by the retardation plate 40 is 90°, an intensity P' of the light beam emitted from the analyzer 18 is represented by the following equation (18), which is derived from the above equation (11).

$$P' = \frac{cP_0}{2} \{1 - (\pi/V\pi)V_0\sin\omega t\} \quad (18)$$

Thus, the AC component of the light intensity P' changes as a function of the voltage $V_0\sin\omega t$.

On the other hand, the intensity P of the light beam transmitted through the temperature-sensitive element 62 is received by the light-detective portion 30 through the fiber collimator 22 and fiber 28 is represented by the following equation (19):

$$P = k \cdot P' = \frac{k \cdot cP_0}{2} \{1 - (\pi/V\pi)V_0\sin\omega t\} \quad (19)$$

where,
k: light transmittance of the element 62

Since the light transmittance k of the temperature-sensitive element 62 depends upon the ambient temperature T, the transmittance k is expressed as a function of the temperature T, and the DC component of the electric signal E produced by the light-detective portion 30 changes as a function of the temperature T only.

The measuring instrument of FIG. 6 uses the same detectors 56, 58 and divider 60 as used in the embodiment of FIG. 5 adapted to determine the magnetic field strength together with the ambient temperature. The DC component of the signal E selected by the detector 56 is utilized by the temperature determining means 86 to determine the temperature T. The output of the divider 60 is applied to voltage determining means 90 to determine the magnitude of the voltage V applied to the Pockels'-effect element 38. Like the preceding embodiments, the present embodiment permits the instrument to be small-sized and compact and economical to manufacture, and provides improved durability of the fiber supporting ceramic insulators, for the same reasons as described above.

As in the above-described instruments adapted to determine the temperature and the magnetic field strength, the detector 56 and the temperature determining means 86 constitute temperature measuring means for selecting the DC component of the electric signal E and thereby determining the ambient temperature of the temperature-sensitive element 62, and the detectors 56, 58, divider 60 and voltage determining means 90 constitute voltage measuring means for calculating the ratio of the AC component to the DC component and thereby determining the voltage V applied to the Pockel's-effect element 38.

Like the instrument of FIG. 5, the present instrument of FIG. 6 may determine the voltage V based on the AC component, without using the divider 60.

Referring to FIG. 7, there is shown an optical measuring instrument adapted to concurrently determine the ambient temperature, magnetic field strength and voltage. The present instrument uses thermo-optical changing means for changing the amount of a light beam transmitted therethrough, and an optical element such as $Bi_{12}SiO_{20}$ which has both the Faraday effect and the Pockel's effect.

The embodiment of FIG. 7 has a magnetic field and voltage sensing head 66, in which the retardation plate 40 is disposed in series with an optical element 64 such as $Bi_{12}SiO_{20}$ which serves as a Faraday-effect element and a Pockel's-effect element. The retardation plate 40 is disposed between the polarizer 16 and the optical element 64, while the optical element 64 is disposed between the retardation plate 40 and the analyzer 18. The sensing head 66 is optically coupled with the same temperature sensing head 42 as used in the embodiment of FIG. 5, such that the output fiber collimator 46 of the head 42 is connected to the input fiber collimator 20 of the head 66 through the optical fiber 54. The two sensing heads 42, 66 constitute the sensing head portion 14. A voltage V is applied to the transparent electrodes 41, 41 of the optical element 64.

As in the measuring instrument of FIG. 5, the light beam emitted by the light-emitting portion 24 is directed to the temperature sensing head 42 through the fiber 26, and the beam transmitted through the head 42 is incident upon the fiber collimator 20 of the magnetic field and voltage sensing head 66. The incident beam is transmitted through the polarizer 16, retardation plate 40, optical element 64 and analyzer 18 in the order of description, and is emitted from the sensing head 66 through the fiber collimator 22. The light beam transmitted through the sensing head portion 14 is directed to the light-detective portion 30 through the optical fiber 28, which converts the received light beam into a corresponding electric signal E.

The electric signal E is applied to the DC component detector 56, and the first and second component detectors 32, 34 as provided in the first embodiment of FIG. 1. The detector 56 selects a DC component $E_{dc}$ of the electric signal E. The first component detector 32 selects the first component $E\omega$ of the signal E which has the same angular frequency $\omega$ a those of the applied magnetic field H and voltage V, while the second component detector 34 selects the second component $E_{2\omega}$ of the signal E which has an angular frequency $2\omega$ which is two times as those of the magnetic field H and voltage V. The DC component Edc selected by the detector 56 and the first component Eω selected by the detector 32 are applied to a first divider 68, while the DC component Edc and the second component E2ω selected by the detector 34 are applied to a second divider 70. The first divider 68 divides the first AC component Eω by the DC component Edc. The second divider 70 divides the second AC component E2ω by the DC component Edc.

Concerning the Faraday effect provided by the optical element 64 as the Faraday-effect element, the intensity P of the light beam emitted from the fiber collimator 22 is represented by the above equation (17), where the light beam incident upon the fiber collimator 20 has an intensity $P_0$, and the optical bias $\theta$ given by the retardation plate 40 is 45°. In this case, the intensity P can be expressed by only the component Eω of the signal E having the same angular frequency ω as those of the applied magnetic field H. Where the optical bias $\theta$ is 0°, the intensity P is represented by the following equation (20), which is derived from the above equation (3). In this case, the intensity P can be expressed by only the component E2ω of the signal E having the angular frequency 2ω which is two times those of the magnetic field H.

$$P = \frac{cP_0}{2} \{2 + (\nu LH_0)^2 \cdot \cos 2\omega t\} \quad (20)$$

Concerning the Pockel's effect provided by the optical element 64 as the Pockel's-effect element, the intensity P is represented by the following equation (21), which is derived from the above equation (11), where the optical bias 8 given by the retardation plate 40 is 0°. In this case, the intensity P can be expressed by only the component E2ω. Where the optical bias $\theta$ is 90°, the intensity P is represented by the following equation (22) and can be expressed by the component Eω.

$$P = \frac{cP_0}{2} \{2 + (1/4) \cdot (\pi/V\pi)^2 V_0^2 \cos 2\omega t\} \quad (21)$$

$$P = \frac{cP_0}{2} \{1 - (\pi/V\pi)V_0 \sin \omega t\} \quad (22)$$

Therefore, the measuring instrument of FIG. 7 can be adapted such that the component Pω having the angular frequency ω of the light beam transmitted through the sensing head portion 14 changes with the applied magnetic field H, while the component P2ω having the angular frequency 2ω of the transmitted light beam changes with the applied voltage V, if the relative angular difference $\theta_0$ between the polarizer and analyzer 16, 18, the rotation angle $\phi$ of the optical element 64 as the rotatory element, and the optical bias $\theta$ of the retardation plate 40 are suitably determined. In other words, the component Eω having the angular frequency ω of the electric signal E produced by the light-detective portion 30 changes with the applied magnetic field H ($H_0$), while the component E2ω of the signal E changes with the voltage V.

That is, the output of the first component detector 32 which selects the component Eω of the electric signal E having the same angular frequency ω as that of the applied magnetic field H changes with the amplitude $H_0$ of the magnetic field H. On the other hand, the output of the second component detector 34 which selects the component E2ω of the signal E having the angular frequency 2ω two times as high as that of the voltage V changes with the amplitude $V_0$ of the voltage V.

Since the first and second AC components Eω and E2ω selected by the respective detectors 32, 34 are proportional to the DC component Edc selected by the DC component detector 56, these AC components are applied to the respective first and second dividers 68, 70 while the DC component Edc is applied to the two dividers 68, 70, so that the first AC component Eω is divided by the DC component Edc by the first divider 68, while the second AC component E2ω is divided by the DC component Edc by the second divider 70, as in the preceding embodiments of FIGS. 5 and 6. The outputs Eω and E2ω of the first and second dividers 68, 70 representing the magnetic field strength and the voltage are not influenced by a change in the DC component Edc, and are applied to respective magnetic field and voltage determining means 92, 94 for accurately determining the amplitude $H_0$ of the magnetic field H and the amplitude $V_0$ of the voltage V.

In the meantime, the DC component Edc of the electric signal E produced by the light-detective portion 30 changes with the ambient temperature T of the temperature sensing head 42, as in the embodiments of FIGS. 5 and 6. The DC component Edc is selected by the detector 56 and is applied to the temperature determining means 86, to determine the ambient temperature of the head 42.

The determining means 86, 92, 94 may or may not be part of the measuring instrument.

As explained above, the present measuring instrument of FIG. 7 is capable of concurrently determining the ambient temperature, and two electric quantities, i.e., magnetic field strength and voltage, by using only one optical fiber 28 for optically connecting the sensing head portion 14 and the light-detective portion 30. Accordingly, the present embodiment has the same advantages as provided by the preceding embodiments.

In the embodiment of FIG. 7 wherein the magnetic field H and the voltage V are concurrently measured, electric power can also be determined at the same time.

The optical element 64 described above may be replaced by a combination of a Pockel's-effect element and a Faraday-effect element which are disposed in series.

While the transparent electrodes 41, 41 for applying the voltage V to the optical element 64 are provided on the opposite faces of the optical element 64 such that the light beam passes through the electrodes 41, the electrodes 41 may be replaced by a pair of electrodes provided on the other opposite faces of the element 64 which are opposed to each other in a direction perpendicular to the direction of propagation of the light beam, depending upon the properties of the element 64.

EXAMPLES

To further clarify the concept of the present invention, some examples of the invention will be described. It is to be understood, however, that the invention is not limited to the details of the examples, but may be embodied with various changes, modifications and improvements, which may occur to those skilled in the art, without departing from the spirit of the invention.

EXAMPLE 1

The optical element 37 having dimensions of $5 \times 5 \times 10.7$ mm was prepared from $Bi_{12}SiO_{20}$ which has the Faraday effect and a rotatory power. The optical element 37 was oriented such that the length L [as appearing in the above equation (1)]along the direction of propagation of a light beam is 10.7 mm. The light beam, which has a wavelength $\lambda$ of 870 nm, was transmitted through the optical element 37 to measure the rotation angle $\phi$ of the polarization plane of the beam at the room temperature. The measurement was 112.5°. The temperature dependence of the rotation angle $\phi$ was $-0.3 \times 10^2$ (deg/° C.mm).

The optical element 37 was disposed between the polarizer 16 and the analyzer 18 whose angular difference $\theta_0$ is 0°. Thus, the measuring instrument of FIG. 2 adapted to determine the ambient temperature T and the magnetic field H was prepared. Based on the above equation (6), the output $E_T$ ($P_T$) of the ratio calculator 36 was approximately estimated according to the following equation (23). This equation (23) indicates that the output $E_T$ is proportional to the ambient temperature T.

$$E_T = \sqrt{2}/4 \, (1 - 6\delta\phi T) \qquad (23)$$

In formulating the approximate equation (23) from the equation (6), the value $\cos(\delta\phi T)$ was approximated to 1, while the value $\sin(\delta\phi T)$ was approximated to $\delta\phi T$.

The sensing head portion 14 of the instrument was placed in a thermostat, and the magnetic field H of 100 Oe was applied to the sensing head portion 10 (as indicated at H in FIG. 2). In this condition, the first component detector 32 was adjusted so that the output $E\omega$ of the detector 32 was 1.00V at 25° C. Then, the output $E\omega$ was measured by changing the ambient temperature T from $-25°$ C. up to 75° C. The output $E\omega$ was 0.95V at 75° C., and 1.05V at $-25°$ C. This means that the output $E\omega$ had a variation of about 5%. The magnetic field H was varied over a range of 1-200 Oe at 25° C., to measure an error in determining the magnetic field. The error was found to be $\pm 0.5\%$.

The ratio calculator 36 was adjusted so that the output $E_T$ of the calculator 36 at 25° C. was 1.00V. The output $E_T$ was measured over the same temperature range as described above. The output $E_T$ was 1.18V at 75° C., and 0.85V at $-25°$ C. There was found a variation of about 18% of the output $E_T$ with a temperature difference of 50° C. The detecting error of the first detector 32 was about 0.005V, and the error in determining the temperature was about 1.4° C.

It was found therefore that the present measuring instrument was capable of measuring the magnetic field with the measuring error of $\pm 5.5\%$ over the temperature range between $-25°$ C. and 75° C., and measuring the temperature with the measuring error of $\pm 1.4°$ C. over the same temperature range.

If the magnetic field H determined by the magnetic field determining means 80 is compensated for the temperature variation based on the temperature determined by the temperature determining means 82, the measuring error due to the temperature variation can be lowered to improve the measuring accuracy of the magnetic field H.

EXAMPLE 2

The Pockel's-effect element 38 was prepared from $LiNbO_3$, and the temperature-sensitive element 62 was prepared from GaAs. By using these elements 38, 62, the measuring instrument of FIG. 6 adapted to determine the temperature T and voltage V was prepared.

The Pockel's-effect element 38 was oriented such that the Z axis of the crystal of the element 38 was parallel to the direction of propagation of the light beam. As indicated in FIG. 6, the electrodes 41, 41 were formed on the opposite faces (X-axis planes) of the element 38 which are opposed to each other in the direction perpendicular to the direction of propagation of the beam. The instrument used a light-emitting diode as the light source of the light-emitting portion 24, which is adapted to emit a light beam having a wavelength $\lambda$ of 0.85 $\mu$m. A photodiode was used as the light-detective element of the light-detective portion 30.

The sensing head portion 14 of the thus constructed measuring instrument was subjected to the varying ambient temperature, and the temperature was determined based on the DC component selected by the detector 56. The measuring error of the temperature was found to be as small as $\pm 5°$ C. Further, the voltage applied to the electrodes 41, 41 of the Pockel's-effect element 38 was changed, and the voltages were determined based on the outputs of the divider 60. The measuring error of the voltage V was found to be as small as $\pm 0.01$V.

EXAMPLE 3

The optical element 64 was prepared from $Bi_{12}SiO_{20}$ having the Pockel's effect and the Faraday effect. By using this optical element 64, the instrument of FIG. 7 adapted to measure the temperature, voltage and magnetic field was prepared. The optical element 64 was oriented such that the [100] axis was parallel to the direction of propagation of the light beam. The length L of the element 64 in the direction of propagation of the beam was 4 mm. As shown in FIG. 7, the electrodes 41, 41 were formed on the opposite faces of the element 64 which are opposed to each other in the direction of propagation of the beam. The instrument used a light-emitting diode as the light source of the light-emitting portion 24, which is adapted to emit a light beam having a wavelength $\lambda$ of 0.85 $\mu$m. A photodiode was used as the light-detective element of the light-detective portion 30.

The temperature, magnetic field and voltage were measured by the instrument of FIG. 7. The measuring error was found to be as small as $\pm 2°$ C. for the temperature, as small as $\pm 0.1$ Oe for the magnetic field, and as small as $\pm 0.1$V for the voltage.

EXAMPLE 4

A YIG single crystal of Tb replacement type was prepared in a solid reaction process. A variation of the Verdet's constant of the YIG crystal due to a change in the temperature was measured over the temperature range between $-20°$ C. and 80° C. The variation was $\pm 1\%$. The temperature dependence of the amount of light transmission through the YIG crystal was $-0.1\%$/° C.

The YIG crystal was used as the optical element 37 of the sensing head portion 14 of FIG. 2. This sensing head portion 14 was used to prepare a measuring instrument which includes the detecting portion 56, 58, 60 of FIG. 5, for determining the temperature and magnetic field. The error of measurement of the temperature based on the output of the DC component detector 56 was as small as $\pm 5°$ C., while the error of measurement of the magnetic field based on the output of the divider 60 was as small as ±0.05 Oe.

What is claimed is:

1. An optical measuring instrument including a light-emitting portion for emitting a light beam, a sensing head portion through which said light beam is transmitted and which influences the transmitted light beam depending upon a physical quantity to be measured, a light-detective portion receiving the light beam transmitted through said sensing portion and producing an electric signal corresponding to the received light beam, and a detecting portion for selecting a component of said electric signal which changes with said physical quantity, to determine said physical quantity, wherein the improvement comprises:

said sensing head portion including thermo-optical changing means for changing a first component of said transmitted light beam with an ambient temperature, and electro-optical changing means, including a Pockel's effect element, for changing a second component of said transmitted light beam with an electric quantity;

said light-detective portion producing an electric signal having a first and a second component which correspond to said first and second components of said transmitted light beam, respectively;

said detecting portion including means for selecting said first component of said electric signal and thereby determining said ambient temperature, and means for selecting said second component of said electric signal and thereby determining said electric quantity.

2. An optical measuring instrument according to claim 1, wherein said thermo-optical changing means comprises means for changing a quantity of said light beam transmitted therethrough in response to a change in said ambient temperature.

3. An optical measuring instrument comprising:

a light-emitting portion for emitting a light beam;

a sensing head portion including a Faraday-effect element having the Faraday effect, a rotatory element having a rotatory power dependent on a temperature and disposed in series with said Faraday-effect element, a polarizer disposed between said light-emitting portion and a series of said Faraday-effect element and said rotatory element, to receive said light beam, and an analyzer receiving said light beam transmitted through said polarizer, said Faraday-effect element and said rotatory element, said light beam being modulated by said Faraday-effect and rotatory elements by an ambient temperature thereof and an AC magnetic field applied thereto;

a light-detective portion receiving said light beam modulated by said sensing head portion and producing an electric signal corresponding to the received light beam;

first-component selecting means for selecting a first component ($P\omega$) of said electric signal which has a same angular frequency as that of said AC magnetic field, a strength of said AC magnetic field or an amount of an electric current which produces said AC magnetic field being determined based on said first component ($P\omega$) of said electric signal; and second-component selecting means for selecting a second component ($P_{2\omega}$) of said electric signal which has an angular frequency which is two times that of said AC magnetic field; and ratio calculating means for calculating a ratio ($P_{2\omega}/P\omega^2$) of said second component ($P_{2\omega}$) to said first component ($P\omega$) raised to the second power, said ambient temperature being determined based on said ratio ($P_{2\omega}/P\omega^2$) calculated by said ratio calculating means.

4. An optical measuring instrument comprising:

a light-emitting portion for emitting a light beam;

a sensing head portion including an optical element having the Faraday-effect and a rotatory power dependent upon a temperature, a polarizer disposed between said light-emitting portion and said optical element and receiving said light beam, and an analyzer receiving said light beam transmitted through said polarizer and said optical element, said light beam being modulated by said optical element by an ambient temperature thereof and an AC magnetic field applied thereto;

a light-detective portion receiving said light beam modulated by said sensing head portion and producing an electric signal corresponding to the received light beam;

first-component selecting means for selecting a first component ($P\omega$) of said electric signal which has a same angular frequency as that of said AC magnetic field, a strength of said AC magnetic field or an amount of electric current which produces said AC magnetic field being determined based on said first component ($P\omega$) of said electric signal;

second-component selecting means for selecting a second component ($P_{2\omega}$) of said electric signal which has an angular frequency which is two times that of said AC magnetic field; and ratio calculating means for calculating a ratio ($P_{2\omega}/P\omega^2$) of said second component ($P_{2\omega}$) to said first component ($P\omega$) raised to the second power, said ambient temperature being determined based on said ratio ($P_{2\omega}/P\omega^2$) calculated by said ratio calculating means.

5. An optical measuring instrument comprising:

a light-emitting portion for emitting a light beam;

a sensing head portion including a Pockel's-effect element having the Pockel's effect, a retardation element effecting birefringence of said light beam depending upon a temperature and disposed in series with said Pockel's-effect element, a polarizer disposed between said light-emitting portion and a series of said Pockel's-effect element and said retardation element, to receive said light beam, and an analyzer receiving said light beam transmitted through said polarizer, said Pockel's-effect element and said retardation element, said light beam being modulated by said Pockel's-effect and retardation elements by an ambient temperature thereof and an AC electric field applied thereto;

a light-detective portion receiving said light beam modulated by said sensing head portion and producing an electric signal corresponding to the received light beam;

first-component selecting means for selecting a first component ($P\omega$) of said electric signal which has a same angular frequency as that of said AC electric field, a strength of said AC electric field or a magnitude of voltage which produces said AC electric field being determined based on said first component ($P\omega$) of said electric signal;

second-component selecting means for selecting a second component ($P_{2\omega}$) of said electric signal which has an angular frequency which is two times that of said AC electric field; and ratio calculating means for calculating a ratio ($P_{2\omega}/P_\omega^2$) of said second component ($P_{2\omega}$) to said first component ($P_\omega$) raised to the second power, said ambient temperature being determined based on said ratio ($P_{2\omega}/P_\omega^2$) calculated by said ratio calculating means.

6. An optical measuring instrument comprising:

a light-emitting portion for emitting a light beam;

a sensing head portion including an optical element having the Pockel's-effect and functioning as a retardation element for effecting birefringence of said light beam depending upon a temperature, a polarizer disposed between said light-emitting portion and said optical element and receiving said light beam, and an analyzer receiving said light beam transmitted through said polarizer and said optical element, said light beam being modulated by said optical element by an ambient temperature thereof and an AC electric field applied thereto;

a light-detective portion receiving said light beam modulated by said sensing head portion and producing an electric signal corresponding to the received light beam;

first-component selecting means for selecting a first component ($P_\omega$) of said electric signal which has a same angular frequency as that of said AC electric field, a strength of said AC electric field or a magnitude of voltage which produces said AC electric field being determined based on said first component ($P_\omega$) of said electric signal;

second-component selecting means for selecting a second component ($P_{2\omega}$) of said electric signal which has an angular frequency which is two times that of said AC electric field; and ratio calculating means for calculating a ratio ($P_{2\omega}/P_\omega^2$) of said second component ($P_{2\omega}$) to said first component ($P_\omega$) raised to the second power, said ambient temperature being determined based on said ratio ($P_2/P_\omega^2$) calculated by said ratio calculating means.

7. An optical measuring instrument comprising:

a light emitting portion for emitting a light beam;

a sensing head portion through which said light beam is transmitted, said sensing head portion including a thermo-optical changing means for changing a quantity of said light beam in response to a temperature to which said thermo-optical changing means is subjected, a first optical element having the Faraday effect for changing a first characteristic of said light beam in response to an AC magnetic field to which said first optical element is subjected, and a second optical element having the Pockel's effect for changing a second characteristic of said light beam in response to an AC voltage to which said second optical element is subjected;

a light detective portion for detecting said light beam transmitted through said sensing head portion, and producing an electric signal having a DC component corresponding to the quantity of said transmitted light beam that is changed by said thermo-optical changing means and a first and a second AC component corresponding to said first and second characteristics of said transmitted light beam that are changed by said first and second optical elements, respectively;

a signal detective portion including first means for detecting said DC component of said electric signal, second means for detecting said first AC component of said electric signal, and third means for detecting said second AC component of said electric signal;

temperature determining means for determining said temperature based on the detected DC component;

magnetic field determining means for determining said AC magnetic field based on the detected first AC component; and voltage determining means for determining said AC voltage based on the detected second AC component.

8. An optical measuring instrument according to claim 7, wherein said first and second optical elements are constituted by a single optical element formed of a material such as $Bi_{12}SiO_{20}$.

9. An optical measuring instrument according to claim 7, wherein said thermo-optical changing means includes a light shielding plate and a bimetal.

10. An optical measuring instrument according to claim 7, wherein said second means of said light detective portion detects, as said first AC component, a component ($P_\omega$) which has the same angular frequency as that of said AC magnetic field, and said third means of said light detective portion detects, as said second AC component, a component ($P_{2\omega}$) which has an angular frequency which is two times as that of said AC voltage.

11. An optical measuring instrument according to claim 7, wherein said magnetic field determining means includes a first divider means for dividing said first AC component by said DC component detected by said first means of said signal detective portion and determines said AC magnetic field based on the divided first AC component, and said voltage determining means includes a second divider means for dividing said second AC component by the DC component and determines said AC voltage based on the divided AC second component.

* * * * *